(12) United States Patent
Son et al.

(10) Patent No.: US 9,076,550 B2
(45) Date of Patent: Jul. 7, 2015

(54) TEST CIRCUIT FOR TESTING REFRESH CIRCUITRY OF A SEMICONDUCTOR MEMORY DEVICE

(71) Applicant: SK hynix Inc., Icheon-si Gyeonggi-do (KR)

(72) Inventors: Jong Ho Son, Icheon-si (KR); Yong Ju Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 196 days.

(21) Appl. No.: 13/720,319

(22) Filed: Dec. 19, 2012

(65) Prior Publication Data
US 2014/0003161 A1 Jan. 2, 2014

(30) Foreign Application Priority Data

Jun. 27, 2012 (KR) .................. 10-2012-0069387

(51) Int. Cl.
*G11C 11/40* (2006.01)
*G01K 7/42* (2006.01)
*G11C 11/406* (2006.01)
*G11C 29/50* (2006.01)
*G11C 29/56* (2006.01)
*G11C 11/41* (2006.01)

(52) U.S. Cl.
CPC .......... *G11C 11/40626* (2013.01); *G01K 7/425* (2013.01); *G11C 11/41* (2013.01); *G11C 29/50016* (2013.01); *G11C 29/56* (2013.01); *G11C 29/56012* (2013.01); *G11C 2029/5002* (2013.01)

(58) Field of Classification Search
CPC ........... G11C 11/406; G11C 11/40626; G11C 11/40618; G01K 7/425
USPC ............... 365/189.02, 189.07, 211, 212, 222; 702/130; 711/105
See application file for complete search history.

(56) References Cited

U.S. PATENT DOCUMENTS

| 6,430,586 | B1 | 8/2002 | Williams |
| 7,720,627 | B1* | 5/2010 | Walker .......................... 702/130 |
| 2007/0268766 | A1* | 11/2007 | Mori .............................. 365/212 |
| 2008/0082290 | A1* | 4/2008 | Jeong et al. .................... 702/130 |
| 2014/0229666 | A1* | 8/2014 | Schoenborn et al. ......... 711/105 |

* cited by examiner

*Primary Examiner* — Pho M Luu
*Assistant Examiner* — Ajay Ojha
(74) *Attorney, Agent, or Firm* — William Park & Associates Ltd.

(57) ABSTRACT

A test circuit of a semiconductor apparatus includes a test temperature information generation section, an erroneous operation prevention unit, and a refresh cycle adjustment unit. The test temperature information generation section outputs test temperature information having a plurality of bits in a test operation mode, and irregularly changes logic values of the plurality of bits and transition time points of the logic values. The erroneous operation prevention unit generates a temperature compensation signal in response to the test temperature information. The refresh cycle adjustment unit changes a cycle of a reference refresh signal in response to the temperature compensation signal, and generates a refresh signal.

18 Claims, 3 Drawing Sheets

US 9,076,550 B2

TEST CIRCUIT FOR TESTING REFRESH CIRCUITRY OF A SEMICONDUCTOR MEMORY DEVICE

CROSS-REFERENCES TO RELATED APPLICATION

The present application claims priority under 35 U.S.C. §119(a) to Korean application number 10-2012-0069387, filed on Jun. 27, 2012, in the Korean Intellectual Property Office, which is incorporated herein by reference in its entirety as set forth in full.

BACKGROUND

1. Technical Field

The present invention generally relates to a semiconductor apparatus, and more particularly, to a test circuit of a semiconductor apparatus.

2. Related Art

A semiconductor apparatus, particularly, a DRAM has characteristics of a volatile memory in terms of characteristics of a memory cell including capacitors. Therefore, the DRAM periodically performs a refresh operation in order to retain data stored in the memory cell. Particularly, a refresh operation performed when the DRAM is in a standby mode is called a self-refresh operation. The self-refresh operation is generally performed at a predetermined cycle.

Since the DRAM is less tolerant to temperature, a data retention time of the memory cell changes according to the temperature. Therefore, there are various technologies of changing the self-refresh cycle according to a change in the temperature.

FIG. 1 is a graph illustrating a change in the self-refresh cycle according to a change in the temperature. As illustrated in FIG. 1, since a data retention time is short according to an increase in the temperature, the self-refresh operation should be performed at a short cycle. Also, since the data retention time is long according to a decrease in the temperature, the self-refresh operation may be performed at a long cycle.

FIG. 2 is a diagram schematically illustrating the configuration of a self-refresh signal generation apparatus in the conventional art. In FIG. 2, the self-refresh signal generation apparatus includes a temperature detection unit 10, an erroneous operation prevention unit 20, and a refresh cycle adjustment unit 30. The temperature detection unit 10 detects the temperature of a semiconductor apparatus and generates temperature information NFLAG<0:n>. The erroneous operation prevention unit 20 decodes the temperature information NFLAG<0:n> and generates temperature compensation signals TCFLAG<0:n>. The refresh cycle adjustment unit 30 receives the temperature compensation signals TCFLAG<0:n>, changes a cycle of a reference self-refresh signal NSRF, and generates a refresh signal PSRF.

The erroneous operation prevention unit 20 also includes a latch section (not shown), an update time decision section (not shown), a latch initialization section (not shown) and the like in order to receive the temperature information NFLAG<0:n> generated by the temperature detection unit 10 and generate the normal temperature compensation signals TCFLAG<0:n>. That is, the erroneous operation prevention unit performs a function of filtering the temperature information abnormally generated.

SUMMARY

A test circuit of a semiconductor apparatus capable of quickly testing the operation stability of an erroneous operation prevention unit for quickly testing operation stability of an erroneous operation prevention unit for filtering abnormal temperature information in a refresh signal generation apparatus is described herein.

In an embodiment, a test circuit of a semiconductor apparatus includes: a test temperature information generation section configured to output test temperature information having a plurality of bits in a test operation mode, and to irregularly change logic values of the plurality of bits and transition time points of the logic values; an erroneous operation prevention unit configured to generate a temperature compensation signal in response to the test temperature information; and a refresh cycle adjustment unit configured to change a cycle of a reference refresh signal in response to the temperature compensation signal, and to generate a refresh signal.

In an embodiment, a test circuit of a semiconductor apparatus includes: a temperature detection unit configured to detect temperature of a semiconductor apparatus and to generate normal temperature information; a temperature information control unit configured to output the normal temperature information in a normal operation mode, and to output test temperature information which is changed to a random value regardless of the temperature of the semiconductor apparatus, in a test operation mode; an erroneous operation prevention unit configured to generate a temperature compensation signal in response to output of the temperature information control unit; and a refresh cycle adjustment unit configured to change a cycle of a reference refresh signal in response to the temperature compensation signal, and to generate a refresh signal.

In an embodiment, a semiconductor apparatus includes: a temperature detection unit configured to detect temperature of a semiconductor apparatus and to generate normal temperature information; a temperature information control unit configured to output the normal temperature information in a normal operation mode, and to output test temperature information which is changed to a random value regardless of the temperature of the semiconductor apparatus, in a test operation mode; a refresh signal generation device configured to generate a refresh signal from a reference refresh signal in response to output of the temperature information control unit; and a memory cell array configured to perform a refresh operation in response to the refresh signal.

BRIEF DESCRIPTION OF THE DRAWINGS

Features, aspects, and embodiments are described in conjunction with the attached drawings, in which.

DETAILED DESCRIPTION

Hereinafter, a test circuit of a semiconductor apparatus according to the present invention will be described in detail with reference to the accompanying drawings through various embodiments.

Figure 3:
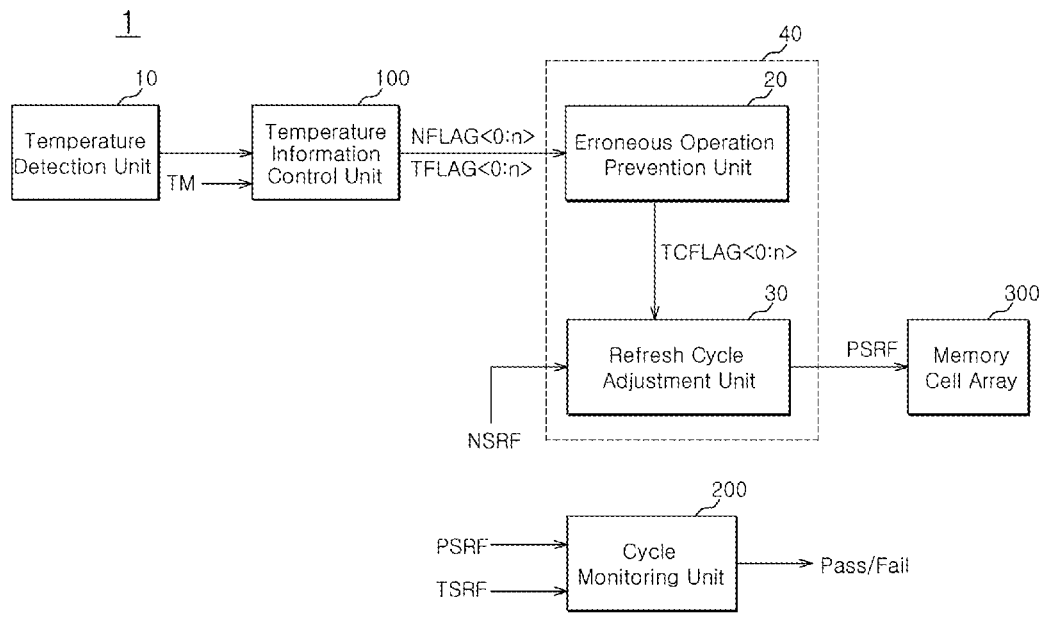
FIG. 3 is a block diagram illustrating the configuration of a test circuit of a semiconductor apparatus according to an embodiment.

FIG. 3 is a block diagram illustrating the configuration of a test circuit 1 of a semiconductor apparatus according to an embodiment. In FIG. 3, the test circuit 1 of the semiconductor apparatus may include a temperature detection unit 10, a temperature information control unit 100, an erroneous operation prevention unit 20, and a refresh cycle adjustment unit 30. The temperature detection unit 10 may be configured to detect the temperature of the semiconductor apparatus and generate normal temperature information NFLAG<0:n>. The temperature detection unit 10 may include an on-chip temperature detection circuit mounted in a chip constituting the semiconductor apparatus. The temperature detection unit 10 may be configured to generate the normal temperature information NFLAG<0:n> having logic values which change according to a change in temperature.

In a normal operation mode, the temperature information control unit 100 may be configured to output the normal temperature information NFLAG<0:n> generated from the temperature detection unit 10. In a test operation mode (i.e., the Temperature information control unit 100 is capable of receiving a test mode signal TM), the temperature information control unit 100 may be configured to output test temperature information TFLAG<0:n> which is changed to random values regardless of the temperature of the semiconductor apparatus. In the normal operation mode, the temperature information control unit 100 may be configured to output normal temperature information NFLAG<0:n> generated by detecting actual temperature of the semiconductor apparatus. In the test operation mode, the temperature information control unit 100 may be configured to generate test temperature information TFLAG<0:n> having various patterns regardless of the actual temperature of the semiconductor apparatus, thereby testing whether the erroneous operation prevention unit 20 stably generates temperature compensation signals TCFLAG<0:n> and whether a refresh signal PSRF is normally generated even when random and irregular change occurs in the temperature information.

The erroneous operation prevention unit 20 and the refresh cycle adjustment unit 30 constitute a refresh signal generation device 40. The erroneous operation prevention unit 20 may be configured to receive the output of the temperature information control unit 100 and generate the temperature compensation signals TCFLAG<0:n>. It is possible for the erroneous operation prevention unit 20 to perform a decoding operation of classifying output logic values of the temperature information control unit 100 into a plurality of temperature ranges, and an operation of filtering a change in an abnormal temperature information value.

In an embodiment, the normal temperature information NFLAG<0:n> and the test temperature information TFLAG<0:n> may include signals having a plurality of bits. For example, when the normal temperature information NFLAG<0:n> and the test temperature information TFLAG<0:n> are 3-bit signals, it is possible for the erroneous operation prevention unit 20 to classify the output logic values of the temperature information control unit 100 into first to third temperature ranges based on most significant bits MSBs of the normal temperature information NFLAG<0:n> and the test temperature information TFLAG<0:n>. That is, the erroneous operation prevention unit 20 classifies the output logic values of the temperature information control unit 100 into the first temperature range, in which the temperature of the semiconductor apparatus is lowest, when temperature information of 000 and 001 is received, classifies the output logic values of the temperature information control unit 100 into the third temperature range, in which the temperature of the semiconductor apparatus is highest, when temperature information of 100, 101, 110, and 111 is received, and classifies the output logic values of the temperature information control unit 100 into the second temperature range, in which the temperature of the semiconductor apparatus is intermediate, when temperature information of 010 and 011 is received. Consequently, it is possible for the erroneous operation prevention unit 20 to classify the temperature information into the first to third temperature ranges, and generate temperature compensation signals TCFLAG<0:n> corresponding to the temperature ranges.

Furthermore, the erroneous operation prevention unit 20 may include circuits, such as a latch section, an update time decision section, or a latch initialization section, in order to substantially prevent logic values of the temperature information from being abnormally changed due to delay of the temperature information on a transmission line, similarly to the conventional art.

The refresh cycle adjustment unit 30 may be configured to receive the temperature compensation signals TCFLAG<0:n> and a reference refresh signal NRSF. The refresh cycle adjustment unit 30 may be configured to adjust a cycle of the reference refresh signal NRSF in response to the temperature compensation signals TCFLAG<0:n>, and generate the refresh signal PSRF. That is, it is possible for the refresh cycle adjustment unit 30 to adjust the cycle of the refresh signal PRSF according to a change in the temperature of the semiconductor apparatus. For example, when the temperature of the semiconductor apparatus is high, the refresh cycle adjustment unit 30 adjusts the cycle of the refresh signal PRSF to be short in response to the temperature compensation signals TCFLAG<0:n>. When the temperature of the semiconductor apparatus is low, the refresh cycle adjustment unit 30 adjusts the cycle of the refresh signal PRSF to be long in response to the temperature compensation signals TCFLAG<0:n>.

In FIG. 3, the test circuit 1 of the semiconductor apparatus further may include a cycle monitoring unit 200. The cycle monitoring unit 200 may be configured to receive the refresh signal PSRF and a test refresh signal TSRF. It is possible for the cycle monitoring unit 200 to compare the cycle of the refresh signal PSRF with the cycle of the test refresh signal TSRF, and to generate a test result signal Pass/Fail. When the test temperature information TFLAG<0:n> is generated by the temperature information control unit 100, the test refresh signal TSRF has an estimated cycle corresponding to the test temperature information TFLAG<0:n>. For example, when the test temperature information TFLAG<0:n> has information that the temperature of the semiconductor apparatus is high, the cycle of the test refresh signal TSRF is short. When the test temperature information TFLAG<0:n> has information that the temperature of the semiconductor apparatus is low, the cycle of the test refresh signal TSRF is long.

The cycle monitoring unit 200 may be configured to compare the cycle of the test refresh signal TSRF, which has the estimated cycle corresponding to the test temperature information TFLAG<0:n>, with the cycle of the refresh signal PSRF actually generated according to the test temperature information TFLAG<0:n>, and to generate the test result signal Pass/Fail. When the cycle of the test refresh signal TSRF coincides with the cycle of the refresh signal PSRF, the test result signal is output as Pass. When the cycle of the test refresh signal TSRF does not coincide with the cycle of the refresh signal PSRF, the test result signal is output as Fail.

In the test operation mode, the test circuit 1 of the semiconductor apparatus according to an embodiment may compare the refresh signal PSRF, which is actually generated according to the test temperature information TFLAG<0:n> generated by the temperature information control unit 100, with the test refresh signal TSRF, and generate the test result signal Pass/Fail. Consequently, it is possible for the test circuit 1 of the semiconductor apparatus to test the stability of the erroneous operation prevention unit 20 for generating the temperature compensation signals TCFLAG<0:n> from the test temperature information TFLAG<0:n> when the test temperature information TFLAG<0:n> is irregularly changed.

In FIG. 3, the semiconductor apparatus may include a memory cell array 300. The memory cell array 300 is a space capable of storing data. The memory cell array 300 may be configured to perform a refresh operation in response to the refresh signal PSRF in order to retain the data stored in the memory cell array 300.

Figure 4:
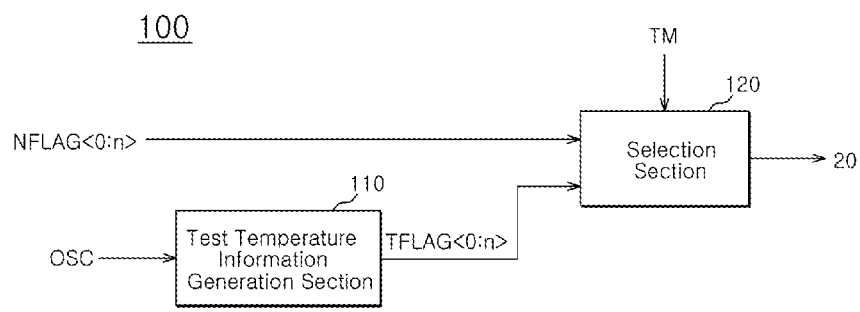
FIG. 4 is a block diagram illustrating the configuration of a temperature information control unit of FIG. 3 according to an embodiment.

FIG. 4 is a block diagram illustrating the configuration of the temperature information control unit 100 of FIG. 3 according to an embodiment. In FIG. 4, the temperature information control unit 100 may include a test temperature information generation section 110 and a selection section 120. In the test operation mode, the test temperature information generation section 110 may be configured to receive an oscillation signal OSC and generate the test temperature information TFLAG<0:n>. The oscillation signal OSC oscillates at a predetermined cycle. It is possible for the test temperature information generation section 110 to generate the test temperature information TFLAG<0:n>, which is changed to random values, using the oscillation signal OSC.

It is possible for the test temperature information generation section 110 to irregularly change logic values of bits of the test temperature information TFLAG<0:n> and transition time points of the logic values.

The test temperature information generation section 110 may be realized as a linear feedback shift register (LFSR). The linear feedback shift register (LFSR) may be enabled in response to a test mode signal TM, and may generate the test temperature information TFLAG<0:n>, which is randomly and irregularly changed, using the oscillation signal OSC. The test mode signal TM is used to distinguish the normal operation mode from the test operation mode, and is enabled for a test operation.

The selection section 120 may be configured to receive the normal temperature information NFLAG<0:n> output from the temperature detection unit 10, and receive the test temperature information TFLAG<0:n> output from the test temperature information generation section 110. The selection section 120 may be configured to output one of the normal temperature information NFLAG<0:n> and the test temperature information TFLAG<0:n> to the refresh cycle adjustment unit 30 according to an operation mode. It is possible for the selection section 120 to output the normal temperature information NFLAG<0:n> to the refresh cycle adjustment unit 30 in the normal operation mode, and to output the test temperature information TFLAG<0:n> to the refresh cycle adjustment unit 30 in the test operation mode.

The selection section 120 may include a multiplexer configured to output one of the normal temperature information NFLAG<0:n> and the test temperature information TFLAG<0:n> in response to the test mode signal TM.

Figure 5:
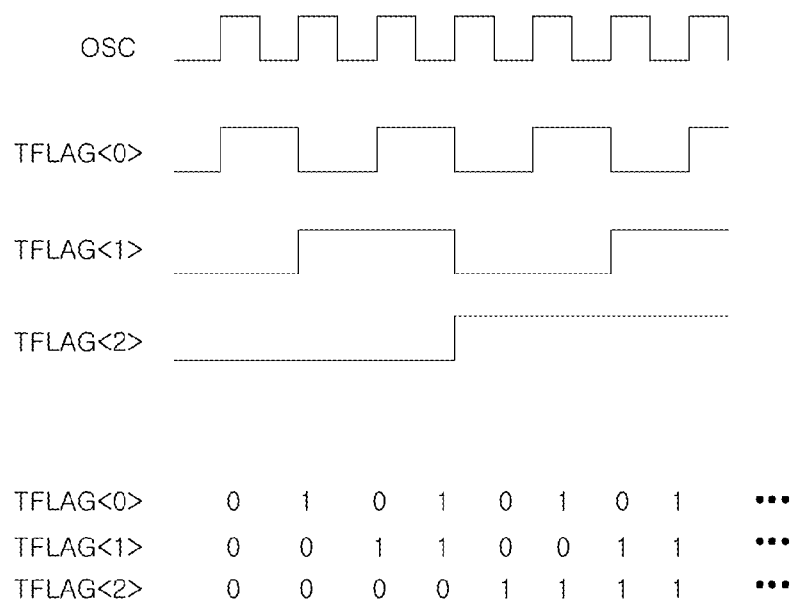
FIG. 5 is a diagram illustrating an example of test temperature information generated by a test temperature information generation unit of FIG. 4.

FIG. 5 is a diagram illustrating an example of the test temperature information TFLAG<0:n> generated by the test temperature information generation section 110. FIG. 5 illustrates that the test temperature information TFLAG<0:n> may include 3 bits. The test temperature information generation section 110 may be configured to receive the oscillation signal OSC, and generate first to third bits TFLAG<0> to TFLAG<2> of the test temperature information having a cycle increasing to a multiple of the cycle of the oscillation signal OSC. Thus, the first to third bits TFLAG<0> to TFLAG<2> of the test temperature information are changed to irregular logic values (i.e., 1 or 0 as illustrated in FIG. 5), and transition time points of the logic values are also irregular. Consequently, it is possible to generate the test temperature information TFLAG<0:n> having various patterns.

Figure 1:
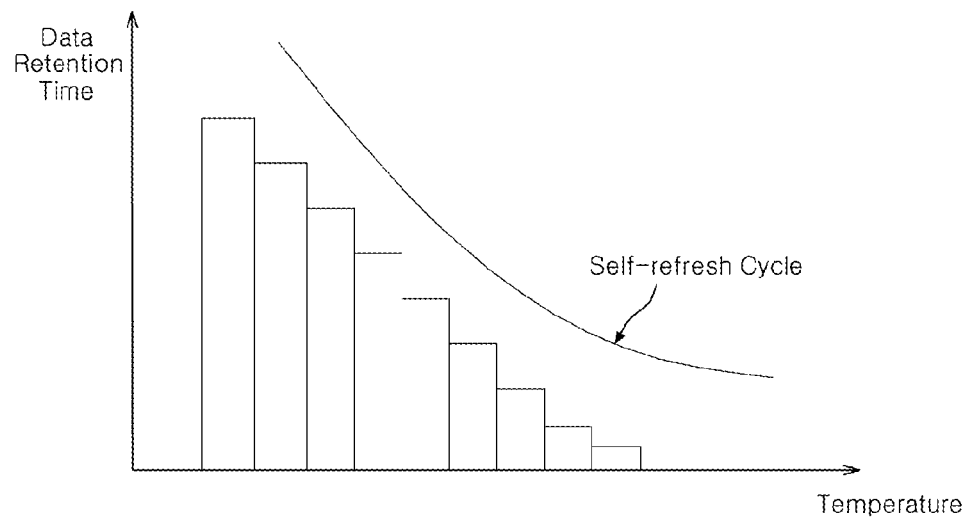
FIG. 1 is a graph illustrating a change in a self-refresh cycle according to a change in temperature.
Figure 2:
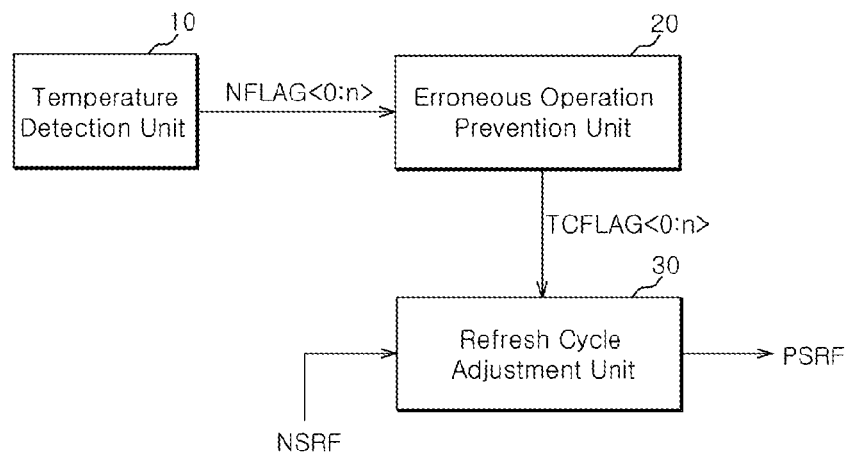
FIG. 2 is a diagram schematically illustrating the configuration of a self-refresh signal generation apparatus in the conventional art.

With reference to FIG. 2 to FIG. 4, the operation of the test circuit 1 of the semiconductor apparatus according to an embodiment will be described. When the test mode signal TM is enabled for the test operation of the semiconductor apparatus, the semiconductor apparatus enters the test operation mode.

The test temperature information generation section 110 generates the test temperature information TFLAG<0:n>, which is changed at random time points and has random values, from the oscillation signal OSC. The erroneous operation prevention unit 20 may generate the temperature compensation signals TCFLAG<0:n> in response to the test temperature information TFLAG<0:n> which is irregularly changed.

The refresh cycle adjustment unit 30 may adjust the cycle of the reference refresh signal NSRF in response to the temperature compensation signals TCFLAG<0:n>, and generate the refresh signal PSRF. The cycle monitoring unit 200 may compare the cycle of the refresh signal PSRF with the cycle of the test refresh signal TSRF, and generate the test result signal Pass/Fail.

When the test result signal is output as Pass, it is possible to determine that the erroneous operation prevention unit 20 has stability capable of normally decoding and filtering irregular temperature information. Additionally, when the test result signal is output as Fail, it is possible to determine that the erroneous operation prevention unit 20 is defective.

When the test operation is completed and the test mode signal TM is disabled, the semiconductor apparatus enters the normal operation mode, and the erroneous operation prevention unit 20 receives the normal temperature information NFLAG<0:n> generated by the temperature detection unit 10. The erroneous operation prevention unit 20 and the refresh cycle adjustment unit 30 generate the refresh cycle signal PSRF having a cycle corresponding to the normal temperature information NFLAG<0:n>.

The test circuit of the semiconductor apparatus according to an embodiment may generate the test temperature information easily and quickly, thereby quickly detecting whether the reference signal generation device including the erroneous operation prevention unit is defective. Consequently, it is possible to significantly reduce the test time, thereby reducing the fabrication cost of the semiconductor apparatus.

While various embodiments have been described above, it will be understood to those skilled in the art that the embodiments described are by way of example only. Accordingly, the test circuit of the semiconductor apparatus described herein should not be limited based on the described embodiments.

What is claimed is:

1. A test circuit of a semiconductor apparatus comprising:
   a test temperature information generation section configured to output test temperature information having a plurality of bits in a test operation mode, and to irregularly change logic values of the plurality of bits and transition time points of the logic values regardless of a temperature of the semiconductor apparatus, wherein the test temperature information is not dependent on the temperature of the semiconductor apparatus;
   an erroneous operation prevention unit configured to generate a temperature compensation signal in response to the test temperature information; and a refresh cycle adjustment unit configured to change a cycle of a reference refresh signal in response to the temperature compensation signal, and to generate a refresh signal.

2. The test circuit of the semiconductor apparatus according to claim 1, wherein the test temperature information generation section is configured to generate the test temperature information in response to an oscillation signal.

3. The test circuit of the semiconductor apparatus according to claim 1, further comprising:
a cycle monitoring unit configured to compare a test refresh signal, which has a cycle corresponding to the test temperature information, with the refresh signal, and to output a test result.

4. The test circuit of the semiconductor apparatus according to claim 1, further comprising:
a selection section configured to receive normal temperature information, a test mode signal, and the test temperature information sent from the test temperature information generation section, and output one of the normal temperature information and the test temperature information, in response to the test mode signal, to the erroneous operation prevention unit.

5. The test circuit of the semiconductor apparatus according to claim 4, wherein the selection section comprises a multiplexer configured to output the one of the normal temperature information and the test temperature information, in response to the test mode signal.

6. A test circuit of a semiconductor apparatus comprising:
a temperature detection unit configured to detect temperature of the semiconductor apparatus and to generate normal temperature information;
a temperature information control unit configured to output the normal temperature information which is changed depending on the temperature of the semiconductor apparatus in a normal operation mode, and to output test temperature information which is generated to a random value regardless of the temperature of the semiconductor apparatus, in a test operation mode;
an erroneous operation prevention unit configured to generate a temperature compensation signal in response to output of the temperature information control unit; and
a refresh cycle adjustment unit configured to change a cycle of a reference refresh signal in response to the temperature compensation signal, and to generate a refresh signal.

7. The test circuit of the semiconductor apparatus according to claim 6, wherein the temperature information control unit comprises:
a test temperature information generation section configured to generate the test temperature information in response to a test mode signal and an oscillation signal; and
a selection section configured to output one of the normal temperature information and the test temperature information in response to the test mode signal.

8. The test circuit of the semiconductor apparatus according to claim 7, wherein the selection section comprises a multiplexer configured for outputting one of the normal temperature information and the test temperature information in response to the test mode signal.

9. The test circuit of the semiconductor apparatus according to claim 7, wherein the test temperature information generation section comprises a linear feedback shift register.

10. The test circuit of the semiconductor apparatus according to claim 7, wherein the test temperature information includes a plurality of bits, and the test temperature information generation section is configured to irregularly change logic values of the bits of the test temperature information and transition time points of the logic values.

11. The test circuit of the semiconductor apparatus according to claim 6, further comprising:
a cycle monitoring unit configured to compare a test refresh signal, which has a cycle corresponding to the test temperature information, with the refresh signal in the test operation mode, and to output a test result.

12. A semiconductor apparatus comprising:
a temperature detection unit configured to detect temperature of the semiconductor apparatus and to generate normal temperature information;
a temperature information control unit configured to output the normal temperature information which is changed depending on the temperature of the semiconductor apparatus in a normal operation mode, and to output test temperature information which is generated to a random value regardless of the temperature of the semiconductor apparatus, in a test operation mode;
a refresh signal generation device configured to generate a refresh signal from a reference refresh signal in response to output of the temperature information control unit; and
a memory cell array configured to perform a refresh operation in response to the refresh signal.

13. The semiconductor apparatus according to claim 12, wherein the temperature information control unit comprises:
a test temperature information generation section configured to generate the test temperature information in response to a test mode signal and an oscillation signal; and
a selection section configured to output one of the normal temperature information and the test temperature information in response to the test mode signal.

14. The semiconductor apparatus according to claim 13, wherein the selection section comprises a multiplexer configured for outputting one of the normal temperature information and the test temperature information in response to the test mode signal.

15. The semiconductor apparatus according to claim 13, wherein the test temperature information generation section comprises a linear feedback shift register.

16. The semiconductor apparatus according to claim 13, wherein the test temperature information includes a plurality of bits, and the test temperature information generation section is configured to irregularly change logic values of the bits of the test temperature information and transition time points of the logic values.

17. The semiconductor apparatus according to claim 12, wherein the refresh signal generation device comprises:
an erroneous operation prevention unit configured to generate a temperature compensation signal in response to output of the temperature information control unit; and
a refresh cycle adjustment unit configured to change a cycle of the reference refresh signal in response to the temperature compensation signal, and to generate the refresh signal.

18. The semiconductor apparatus according to claim 12, further comprising:
a cycle monitoring unit configured to compare a test refresh signal, which has a cycle corresponding to the test temperature information, with the refresh signal in the test operation mode, and to output a test result.

* * * * *